United States Patent
Po

(10) Patent No.: US 9,190,415 B2
(45) Date of Patent: Nov. 17, 2015

(54) MEMORY HAVING A VOLTAGE SWITCH CIRCUIT WITH ONE BIAS VOLTAGE CHANGED IN EACH STATE OF CONDITIONING

(71) Applicant: eMemory Technology Inc., Hsin-Chu (TW)

(72) Inventor: Chen-Hao Po, Hsinchu (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 14/318,688

(22) Filed: Jun. 29, 2014

(65) Prior Publication Data

US 2015/0092507 A1 Apr. 2, 2015

Related U.S. Application Data

(60) Provisional application No. 61/885,021, filed on Oct. 1, 2013.

(51) Int. Cl.
| | | |
|---|---|---|
| *G11C 7/12* | (2006.01) | |
| *H01L 27/115* | (2006.01) | |
| *H01L 29/423* | (2006.01) | |
| *H01L 29/49* | (2006.01) | |
| *G11C 5/14* | (2006.01) | |
| *G11C 16/04* | (2006.01) | |
| *G11C 16/28* | (2006.01) | |
| *G11C 16/30* | (2006.01) | |
| *H01L 21/28* | (2006.01) | |

(52) U.S. Cl.
CPC .......... *H01L 27/11558* (2013.01); *G11C 5/147* (2013.01); *G11C 7/12* (2013.01); *G11C 16/0408* (2013.01); *G11C 16/28* (2013.01); *G11C 16/30* (2013.01); *H01L 21/28273* (2013.01); *H01L 27/11519* (2013.01); *H01L 27/11521* (2013.01); *H01L 29/42328* (2013.01); *H01L 29/4916* (2013.01); *G11C 16/0433* (2013.01)

(58) Field of Classification Search
CPC ........................................................ G11C 7/12
USPC ......................................................... 365/203
See application file for complete search history.

(56) References Cited

U.S. PATENT DOCUMENTS

2014/0233330 A1* 8/2014 Ko et al. ................... 365/189.16

* cited by examiner

*Primary Examiner* — Hoai V Ho
*Assistant Examiner* — Tri Hoang
(74) *Attorney, Agent, or Firm* — Winston Hsu; Scott Margo

(57) ABSTRACT

A voltage switch circuit includes four transistors. The four transistors may be transistors used to build logic gates. The operation of the voltage switch circuit may include precharging the output terminal of the voltage switch circuit, conditioning of the voltage switch circuit and boosting the voltage of the output terminal.

18 Claims, 5 Drawing Sheets

MEMORY HAVING A VOLTAGE SWITCH CIRCUIT WITH ONE BIAS VOLTAGE CHANGED IN EACH STATE OF CONDITIONING

CROSS REFERENCE TO RELATED APPLICATIONS

This non-provisional application claims priority of U.S. provisional application U.S. 61/885,021 filed on Oct. 1, 2013.

BACKGROUND OF THE INVENTION

1. Field of the Invention

The present invention relates to a memory, and more specifically, to a memory having a voltage switch circuit with one bias voltage changed in each state of conditioning.

2. Description of the Prior Art

Memory devices are electronic devices arranged to store electrical signals. The non-volatile memory does not lose its data when the system or device is turned off and may be implemented as a MOS transistor that has a source, a drain, an access or a control gate, and a floating gate. It is structurally the same as standard MOSFET except its gate is floating, which is electrically isolated. There are many structural variations of MOS devices to enhance the operation or reduce the size of non-volatile memory devices.

Considerations including purpose of the device, power consumption, size, retention capacity and duration may influence design of non-volatile memory devices. For example, some non-volatile memory devices may be categorized as floating gate or charge-trapping from a programming perspective.

Non-volatile memory devices may be implemented as non-volatile memory arrays that include a plurality of non-volatile memory cells arranged in rows and columns. In general, 1T non-volatile memory cells operate as follows. During an erase operation, electrons are removed from a floating gate of the non-volatile memory cell, thereby lowering the threshold voltage of the non-volatile memory cell. During a program operation, electrons are injected into the floating gate of the non-volatile memory cell, thereby raising the threshold voltage of the non-volatile memory cell. Thus, during program and erase operations, the threshold voltages of selected non-volatile memory cells are changed. During a read operation, read voltages are applied to selected non-volatile memory cells. In response, read currents flow through these selected non-volatile memory cells.

Certain types of nonvolatile memory devices, circuits employing floating-gate devices, high-voltage drivers and other circuits fabricated in logic CMOS require relatively high voltages (e.g., 10 volts in a 3.3 volt CMOS process). In all these circuits, switches are required to selectively apply the high voltages to specific circuit elements.

Tolerating a high-voltage supply, generating intermediate voltages, as well as generating high-voltage drive signals from logic low-voltage signals while minimizing power consumption, are substantial design parameters for switch circuits adapted to program memory devices.

SUMMARY OF THE INVENTION

An embodiment of the present invention presents a memory. The memory comprises a plurality of write units, a plurality of voltage switch circuits each coupled to a corresponding write unit for controlling the write unit, and a memory address decoder coupled to the voltage switch circuits for outputting an address to select a voltage switch circuit accordingly. Only one bias voltage is changed in each state of conditioning the selected voltage switch circuit.

Another embodiment of the present invention presents a method of operation of a voltage switch circuit. The method comprises precharging an output terminal of the voltage switch circuit to a third voltage magnitude, conditioning the voltage switch circuit, and boosting the output terminal to a write voltage. Only one bias voltage is changed in each state of conditioning the voltage switch circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
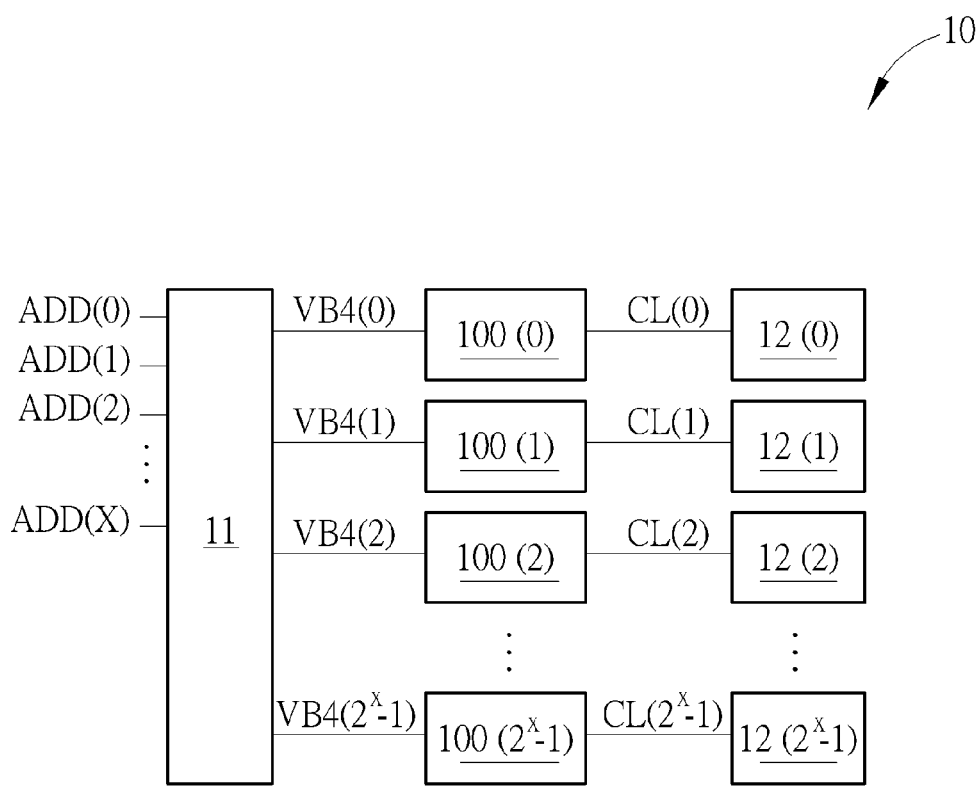
FIG. 1 illustrates a system diagram of a memory according to an embodiment of the present invention.

FIG. 1 illustrates a system diagram of a memory 10 according to an embodiment of the present invention. The memory 10 comprises of a memory address decoder 11, a plurality of voltage switch circuits 100, and a plurality of write units 12. The plurality of voltage switch circuits 100 are coupled to the memory address decoder 11. Each of the plurality of voltage switch circuits 100 is coupled to a corresponding write unit 12. The number of voltage switch circuits 100 may depend on the number of outputs of the memory address decoder 11 that is in turn dependent on the number of bits of a memory address ADD(0) to ADD(X-1) inputted to the memory address decoder 11. For example, the memory address decoder 11 having x bits memory address ADD(0) to ADD (X-1) as an input may have $2^x$ outputs and consequently control $2^x$ voltage switch circuits 100. The memory address ADD(0) to ADD(X-1) may be inputted to the memory address decoder 11 and may correspond to one of the plurality of write units 12. Each of the plurality of write units 12 may be used to control a memory page. The memory address decoder 11 is used to decode the memory address ADD(0) to ADD(X-1) to identify which of the write units 12 shall be selected through activating a corresponding voltage switch circuit 100 of the selected write unit 12. During precharging, conditioning, and boosting operation of the voltage switch circuit 100 corresponding to the selected write unit 12, the voltage at an output terminal CL of the voltage switch circuit 100 may be controlled to generate a corresponding voltage. In the meantime, the voltage switch circuits 100 of the unselected write units 12 may be turned off. Therefore, voltages at output terminals of the voltage switch circuits 100 corresponded to unselected write units 12 shall remain at 0V. In the embodiment, only one write unit 12 may be selected while the remaining write units are unselected.

Figure 2:
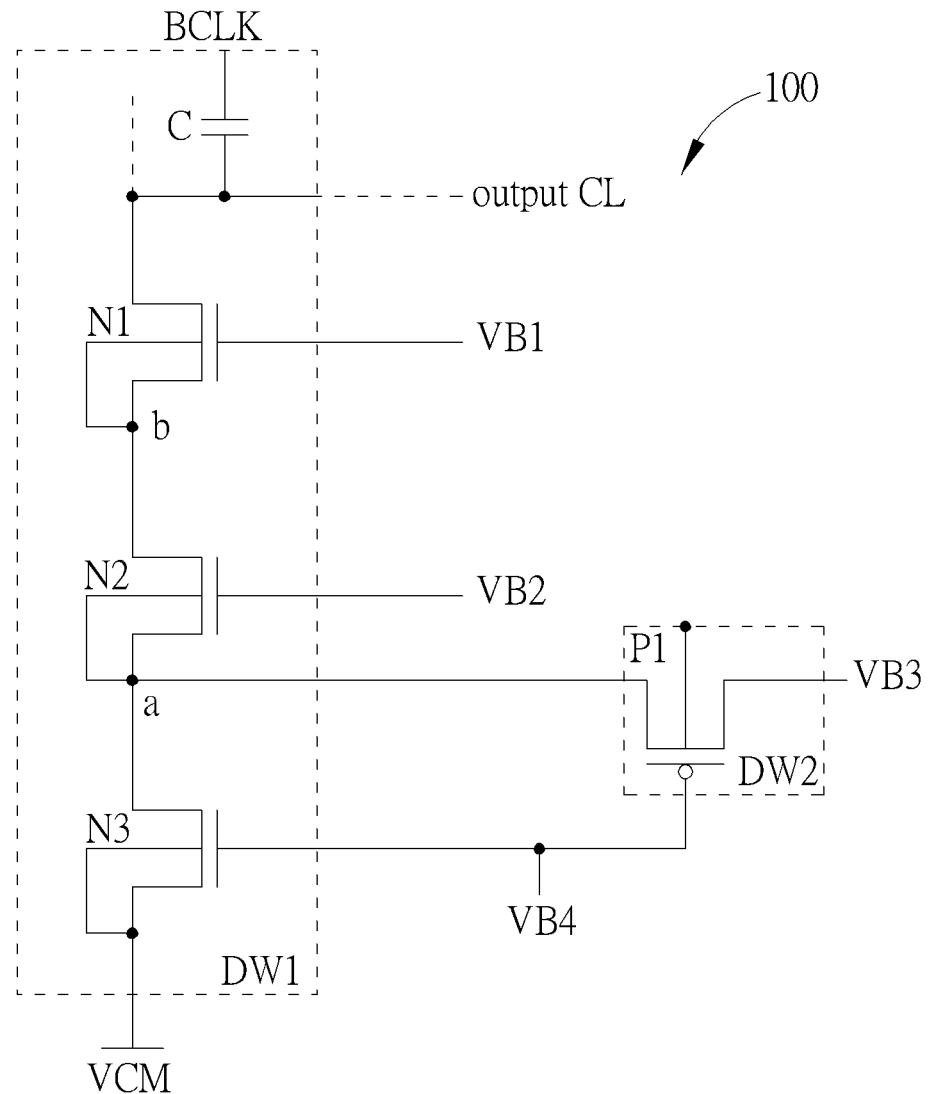
FIG. 2 illustrates a voltage switch circuit of the memory in FIG. 1.

FIG. 2 illustrates a voltage switch circuit 100 of the memory 10. The voltage switch circuit 100 comprises of four transistors N1, N2, N3, P1 and a boosting capacitor C. A first transistor N1 has a first terminal coupled to an output terminal CL, a second terminal, a control terminal coupled to a first bias voltage VB1 and a bulk terminal coupled to the second terminal of the first transistor N1. A second transistor N2 has a first terminal coupled to the second terminal of the first transistor N1, a second terminal, a control terminal coupled to a second bias voltage VB2 and a bulk terminal coupled to the second terminal of the second transistor N2. A third transistor N3 has a first terminal coupled to the second terminal of the second transistor N2, a second terminal, a control terminal and a bulk terminal coupled to the second terminal of the third transistor N3. And a fourth transistor P1 has a first terminal coupled to the second terminal of the second transistor N2, a second terminal coupled to a third bias voltage VB3, a control terminal coupled to the control terminal of the third transistor N3 and to the memory address decoder 11 for receiving a fourth bias voltage VB4, and a bulk terminal. The bulk terminal and the second terminal of the third transistor N3 are coupled to a common mode voltage VCM. The boosting capacitor C has a first terminal coupled to the output terminal CL and a second terminal coupled to a boost clock BCLK. None of the four transistors N1, N2, N3, and P1 of the voltage switch circuit 100 are formed to have a lightly doped region.

The first transistor N1, the second transistor N2 and the third transistor N3 may be NMOS transistors and may be formed on a first deep well DW1. The fourth transistor P1 may be a PMOS transistor and may be formed on a second deep well DW2. The first deep well DW1 and the second deep well DW2 may be deep N-wells. The first deep well DW1 may be coupled to a first deep well voltage VDW1, and the second deep well DW2 and the bulk terminal of the fourth transistor P1 are coupled to a second deep well voltage VDW2.

The value of the first bias voltage VB1 may be the common mode voltage VCM, a power supply voltage VDD, or a first voltage magnitude VM1. The value of the second bias voltage VB2 may be the common mode voltage VCM, the power supply voltage VDD, or a second voltage magnitude VM2. The value of the third bias voltage VB3 may be the common mode voltage VCM, the power supply voltage VDD, or a third voltage magnitude VM3. The value of the fourth bias voltage VB4 may be the common mode voltage VCM, the power supply voltage VDD, or a fourth voltage magnitude VM4.

Figure 3:
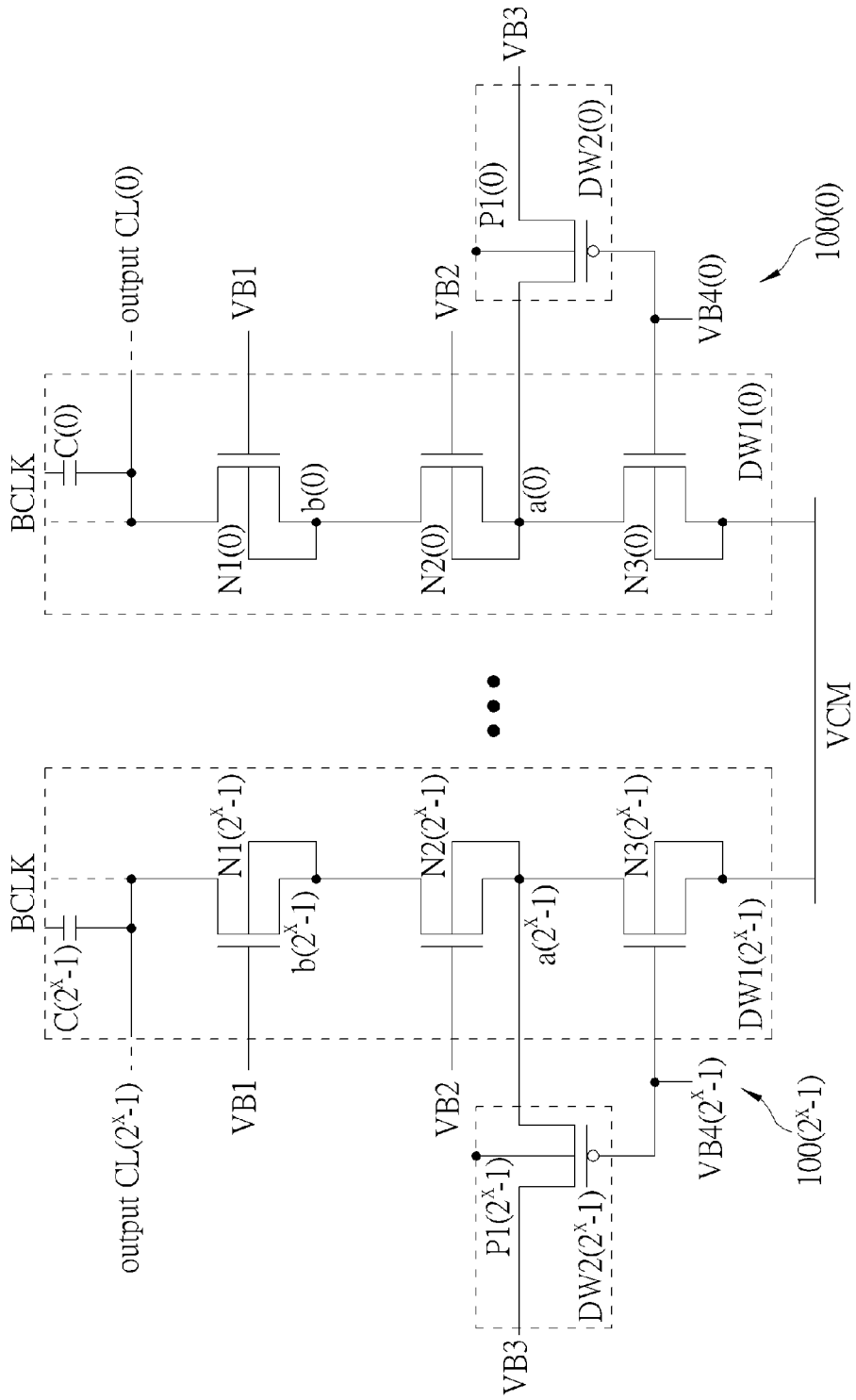
FIG. 3 illustrates an array of voltage switch circuits in FIG. 1.

FIG. 3 illustrates an array of voltage switch circuits 100 in FIG. 1. FIG. 3 shows the array to include $2^x$ voltage switch circuits 100. Each of the voltage switch circuits 100 may receive the fourth bias voltage VB4 from the memory address decoder 11 having a value corresponding to the memory address ADD(0) to ADD(X-1) inputted to the memory address decoder 11. For example, if the selected memory address ADD(0) to ADD(X-1) is equivalent to 0, the control terminals of the third transistor N3(0) and fourth transistor P1(0) of the voltage switch circuit 100(0) may be inputted with the fourth bias voltage VB4 having the common mode voltage VCM and the control terminals of the third transistors N3(1) to N3($2^x$-1) and fourth transistors P1(1) to P1($2^x$-1) of the rest of the voltage switch circuit 100(1) to 100($2^x$-1) may be inputted with the fourth bias voltage VB4 having the fourth voltage magnitude VM4. As can be observed in FIG. 3, in addition to receiving a fourth bias voltage VB4, each of the voltage switch circuits 100 is coupled to a corresponding output terminal CL, i.e. the voltage switch circuit 100(0) is coupled to the output terminal CL(0) and the voltage switch circuit 100($2^x$-1) is coupled to the output terminal CL($2^x$-1). The first bias voltage VB1, the second bias voltage VB2 and the third bias voltage VB3 may be shared by all of the voltage switch circuits 100 in the array or individually supplied to each of the voltage switch circuits 100 in the array. The first transistor N1, the second transistor N2 and the third transistor N3 of each of the voltage switch circuits 100 in the array may be formed on a separate first deep well DW1 as shown in FIG. 3. Or all of the first transistors N1, the second transistors N2 and the third transistors N3 of the voltage switch circuits 100 in the array may share a same first deep well DW1. The fourth transistor P1 of each of the voltage switch circuits 100 in the array may be formed on a separate second deep well DW2 as shown in FIG. 3. Or all of the fourth transistors P1 of the voltage switch circuits 100 in the array may share a same second deep well DW2. By sharing the first deep well DW1 and the second deep well DW2, area of fabrication for the array of voltage switch circuits 100 may be smaller as compared to having the first deep well DW1 and the second deep well DW2 of each voltage switch circuit 100 separated. Though, having the first deep well DW1 and the second deep well DW2 of each voltage switch circuit 100 separated would provide guard from noise that may come from neighboring voltage switch circuits 100.

Figure 4:
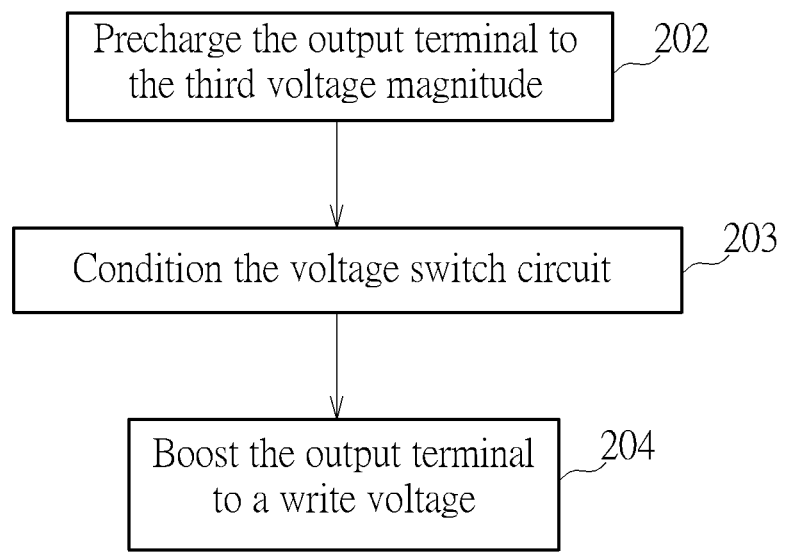
FIG. 4 illustrates a method of operation of the voltage switch circuit in FIG. 3.

FIG. 4 illustrates a method of operation of the voltage switch circuit 100(0) in FIG. 3 when the voltage switch circuit 100(0) is selected and the rest of voltage switch circuits 100(1) to 100($2^x$-1) are not selected by the memory address decoder 11. The method of operation may include but is not limited to the following steps:

Step 202: Precharge the output terminal CL(0) to the third voltage magnitude VM3;

Step 203: Condition the voltage switch circuit 100(0); and

Step 204: Boost the output terminal CL(0) to a write voltage VW.

Figure 5:
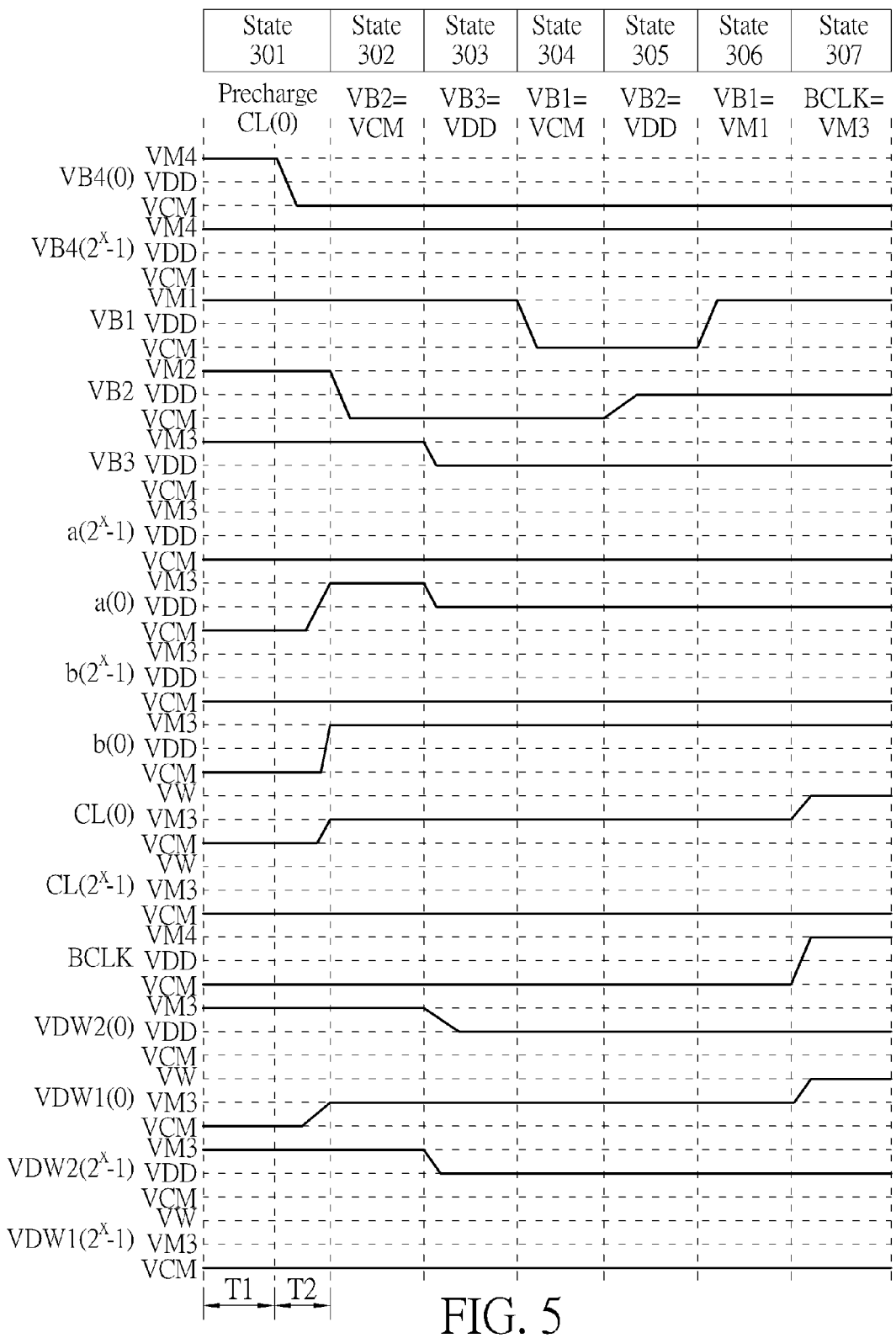
FIG. 5 illustrates the sequence of operation of the voltage switch circuit in FIG. 3.

The voltage switch circuit 100 may be fabricated using a technology that will allow the system to use a power supply VDD of 5V, a common mode voltage VCM of 0V, a first voltage magnitude VM1 of 10V, a second voltage magnitude VM2 of 10V, a third voltage magnitude VM3 of 8V, a fourth voltage magnitude VM4 of 8V, and a write voltage VW of 16V. In some embodiments of the present invention, the first voltage magnitude VM1, the second voltage magnitude VM2, and the third voltage magnitude VM3 may or may not be of the same value. Though the example shows that the values of the first voltage magnitude VM1, the second voltage magnitude VM2, and the third voltage magnitude VM3 are greater than the value of the power supply VDD, the embodiment is not limited to this example. The first voltage magnitude VM1 may be greater than or equal to the second voltage magnitude VM2, and the second voltage magnitude VM2 may be greater than the third voltage magnitude VM3. In some embodiments at least one or all of the first voltage magnitude VM1, the second voltage magnitude VM2, and the third voltage magnitude VM3 may be less than the value of the power supply VDD or, as shown in the example, greater than the power supply VDD. FIG. 5 illustrates the sequence of states for precharging, conditioning, and boosting the voltage switch circuit 100(0) in FIG. 4.

In step 202 (state 301 in FIG. 5), during the first period of time T1, the control terminals of the third transistor N3(0) and the fourth transistor P1(0) may be inputted with the fourth bias voltage VB4(0) having the fourth voltage magnitude VM4, the control terminal of the second transistor N2(0) may be inputted with the second bias voltage VB2 having the second voltage magnitude VM2, and the control terminal of the first transistor N1(0) may be inputted with the first bias voltage VB1 having the first voltage magnitude VM1, thus the third transistor N3(0), the second transistor N2(0) and the first transistor N1(0) may be on, and the fourth transistor P1(0) is off, and the node a(0), the node b(0) and the output terminal CL(0) may have the common mode voltage VCM. The first deep well voltage VDW1 (0) with the common mode voltage may be inputted to the first deep well DW1. The second deep well voltage VDW2(0) with the third voltage magnitude VM3 may be inputted to the second deep well DW2. The second terminal of the boosting capacitor C(0) may be inputted with the boost clock BCLK having the common mode voltage VCM.

In step 202 (state 301 in FIG. 5), during the second period of time T2 which is after the first period of time T1, the fourth bias voltage VB4(0) applied to the control terminals of the fourth transistor P1(0) and the third transistor N3(0) may be changed from the fourth voltage magnitude VM4 to the common mode voltage VCM to activate the voltage switch circuit 100(0). For the voltage switch circuit 100(0), upon turning on of the fourth transistor P1(0), the third bias voltage VB3 with the third voltage magnitude VM3 may pass through the fourth transistor P1(0) to node a(0). Since the third transistor N3(0) is turned off, the voltage of node a(0) would not be pulled down to the common mode voltage VCM by the third transistor N3(0). Further the control terminal of the second transistor N2(0) is inputted with the second bias voltage VB2 having the second voltage magnitude VM2, and the control terminal of the first transistor N1(0) is inputted with the first bias voltage VB1 having the first voltage magnitude VM1, thus the second transistor N2(0) and the first transistor N1(0) are turned on, and the third bias voltage VB3 with the third voltage magnitude VM3 may pass through the second transistor N2(0) and the first transistor N1(0) to change the node b(0) to the third voltage magnitude VM3 and precharge the output terminal CL(0) to the third voltage magnitude VM3. Moreover, the first deep well voltage VDW1(0) may change from the common mode voltage VCM to the third voltage magnitude VM3. The second deep well voltage VDW2(0) may be inputted with the third voltage magnitude VM3. The voltage switch circuits 100 that correspond to the unselected write units 12 are inactivated since the fourth transistors P1(1) to P1($2^x$−1) of the unselected voltage switch circuits 100(1) to 100($2^x$−1) are turned off by biasing the control terminals of the fourth transistors P1(1) to P1($2^x$−1) with the fourth voltage magnitude VM4.

In step 203, the voltage switch circuit 100(0) may be conditioned by following a sequence of states for the first bias voltage VB1, the second bias voltage VB2, the third bias voltage VB3, and the fourth bias voltage VB4(0). The sequence of states for conditioning of the voltage switch circuit 100(0) may include but is not limited to the following:

State 302: Change the second bias voltage VB2 from the second voltage magnitude VM2 to the common mode voltage VCM;

State 303: Change the third bias voltage VB3 from the third voltage magnitude VM3 to the power supply voltage VDD, and change the second deep well voltage VDW2(0) from the third voltage magnitude VM3 to the power supply voltage VDD;

State 304: Change the first bias voltage VB1 from the first voltage magnitude VM1 to the common mode voltage VCM;

State 305: Change the second bias voltage VB2 from the common mode voltage VCM to the power supply voltage VDD; and State 306: Change the first bias voltage VB1 from the common mode voltage VCM to the first voltage magnitude VM1.

In state 302, the third bias voltage VB3 with the third voltage magnitude VM3 is inputted to the second terminal of the fourth transistor P1(0). The fourth bias voltage VB4(0) with the common mode voltage VCM is inputted to the control terminal of the fourth transistor P1(0). The second bias voltage VB2 with the common mode voltage VCM is inputted to the control terminal of the second transistor N2(0). The first bias voltage VB1 with the first voltage magnitude VM1 is inputted to the control terminal of the first transistor N1(0). The first deep well voltage VDW1(0) and the second deep well voltage VDW2(0) with the third voltage magnitude VM3 are inputted to the first deep well DW1 and the second deep well DW2. This will keep the fourth transistor P1(0) and first transistor N1(0) turned on, keep the third transistor N3(0) turned off, and turn off the second transistor N2(0). Thus the node a(0), the node b(0) and the output terminal CL(0) will remain at the third voltage magnitude VM3.

In state 303, the third bias voltage VB3 with the power supply voltage VDD is inputted to the second terminal of the fourth transistor P1(0). The fourth bias voltage VB4(0) with the common mode voltage VCM is inputted to the control terminal of the fourth transistor P1(0). The second bias voltage VB2 with the common mode voltage VCM is inputted to the control terminal of the second transistor N2(0). The first bias voltage VB1 with the first voltage magnitude VM1 is inputted to the control terminal of the first transistor N1(0). The first deep well voltage VDW1(0) with the third voltage magnitude VM3 is inputted to the first deep well DW1. The second deep well voltage VDW2(0) with the power supply voltage VDD is inputted to the second deep well DW2. This will keep the fourth transistor P1(0) and first transistor N1(0) turned on, and keep the second transistor N2(0) and the third transistor N3(0) turned off. Thus the node a(0) will have a voltage level of the power supply voltage VDD and the output terminal CL(0) and the node b(0) will remain at the third voltage magnitude VM3.

In state 304, the third bias voltage VB3 with the power supply voltage VDD is inputted to the second terminal of the fourth transistor P1(0). The fourth bias voltage VB4(0) with the common mode voltage VCM is inputted to the control terminal of the fourth transistor P1(0). The second bias voltage VB2 with a common mode voltage VCM is inputted to the control terminal of the second transistor N2(0). The first bias voltage VB1 with the common mode voltage is inputted to the control terminal of the first transistor N1(0). The first deep well voltage VDW1(0) with the third voltage magnitude VM3 is inputted to the first deep well DW1. The second deep well voltage VDW2(0) with the power supply voltage VDD is inputted to the second deep well DW2. This will keep the fourth transistor P1(0) turned on, keep the second transistor N2(0) and the third transistor N3(0) turned off, and turn off the first transistor N1(0). Thus the node a(0) will remain at the power supply voltage VDD and the output terminal CL(0) and the node b(0) will remain at the third voltage magnitude VM3.

In state 305, the third bias voltage VB3 with the power supply voltage VDD is inputted to the second terminal of the fourth transistor P1(0). The fourth bias voltage VB4(0) with the common mode voltage VCM is inputted to the control terminal of the fourth transistor P1(0). The second bias voltage VB2 with the power supply voltage VDD is inputted to the control terminal of the second transistor N2(0). The first bias voltage VB1 with the common mode voltage VCM is inputted to the control terminal of the first transistor N1(0). The first deep well voltage VDW1(0) with the third voltage magnitude VM3 is inputted to the first deep well DW1. The second deep well voltage VDW2(0) with the power supply voltage VDD is inputted to the second deep well DW2. This will keep the fourth transistor P1(0) turned on, and keep the first transistor N1(0), the second transistor N2(0), and the third transistor N3(0) turned off. Thus the node a(0) will remain at the power supply voltage VDD and the output terminal CL(0) and the node b(0) will remain at the third voltage magnitude VM3. Though the bias voltage VB2 changes from the common mode voltage VCM in state 304 to the power supply voltage VDD in state 305, the second transistor N2(0) remains turned off in state 305 because the voltage level of the node a(0) is also at the power supply voltage VDD.

In state 306, the third bias voltage VB3 with the power supply voltage VDD is inputted to the second terminal of the fourth transistor P1(0). The fourth bias voltage VB4(0) with the common mode voltage VCM is inputted to the control terminal of the fourth transistor P1(0). The second bias voltage VB2 with the power supply voltage VDD is inputted to the control terminal of the second transistor N2(0). The first bias voltage VB1 with the first voltage magnitude VM1 is inputted to the control terminal of the first transistor N1(0). The first deep well voltage VDW1(0) with the third voltage magnitude VM3 is inputted to the first deep well DW1. The second deep well voltage VDW2(0) with the power supply voltage VDD is inputted to the second deep well DW2. This will keep the fourth transistor P1(0) turned on, keep the second transistor N2(0) and the third transistor N3(0) turned off, and turn on the first transistor N1(0). Thus the node a(0) will remain at the power supply voltage VDD and the output terminal CL(0) and the node b(0) will remain at the third voltage magnitude VM3.

States 302 to 306 may change only one bias voltage in each state to prevent errors in the voltage switch circuit 100(0). The changing of only one bias voltage in each state is done to reduce the impact the changing of bias voltage on the components and in turn damage the components. Further states 302 to 306 may be sequentially performed after state 301 and before state 307.

In step 204 (state 307), the fourth bias voltage VB4(0) may be inputted with the common mode voltage VCM, the third bias voltage VB3 may be inputted with the power supply voltage VDD, the second bias voltage VB2 may be inputted with the power supply voltage VDD, the first bias voltage VB1 may be inputted with the first voltage magnitude VM1, the first deep well voltage VDW1(0) may be changed from the third voltage magnitude VM3 to the write voltage VW, and the second deep well voltage VDW2(0) may be inputted with the power supply voltage VDD. This will keep the fourth transistor P1(0) and the first transistor N1(0) turned on, and keep the second transistor N2(0) and the third transistor N3(0) turned off. Thus the node a(0) will remain at the power supply voltage VDD and the node b(0) will remain at the third voltage magnitude VM3. However, since the boost clock BCLK is boosted from the common mode voltage VCM to the fourth voltage magnitude VM4, the output terminal CL(0) is boosted to the write voltage VW from the third voltage magnitude VM3 through coupling of the boosting capacitor C(0). To boost the voltage at the output terminal CL(0), a boosting circuit such as charge pump circuit may be used. The boosting circuit is electrically coupled to the boosting capacitor C(0).

In this embodiment, the voltage switch circuits 100(1) to 100($2^x$−1) may not be activated. And, although the voltage switch circuits 100(1) to 100($2^x$−1) may receive the same first, second and third bias voltages as the voltage switch circuit 100(0), nodes a(1) to a($2^x$−1), nodes b(1) to b($2^x$−1), output terminals CL(1) to CL($2^x$−1), and first deep well voltages VDW1(1) to VDW1($2^x$−1) shall remain at the common mode voltage VCM. The second deep well voltage VDW2(1) to VDW2($2^x$−1) may or may not have the same voltage as the second deep well voltage VDW2(0).

The embodiment has disclosed a structure a memory and a structure of a voltage switch circuit. The voltage switch circuit includes four transistors that may be transistors typically used for logic gates. The voltage switch circuit does not make use of high voltage MOSFET and none of the transistors have been fabricated to have lightly doped regions. The removal of the use of lightly doped regions would prevent the voltage switch circuit from suffering area penalty. The voltage switch circuit may save in area of fabrication since the circuit is simple and has no need for cross coupling between transistors as required in conventional voltage switch circuit to perform high voltage operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory comprising:
   a plurality of write units;
   a plurality of voltage switch circuits each coupled to a corresponding write unit and configured to control the write unit, each voltage switch circuit of the plurality of voltage switch circuits comprising:
   a first transistor having a first terminal coupled to a corresponding write unit, a second terminal, a control terminal coupled to a first bias voltage and a bulk terminal coupled to the second terminal of the first transistor;
   a second transistor having a first terminal coupled to the second terminal of the first transistor, a second terminal, a control terminal coupled to a second bias voltage and a bulk terminal coupled to the second terminal of the second transistor;
   a third transistor having a first terminal coupled to the second terminal of the second transistor, a second terminal, a control terminal and a bulk terminal coupled to the second terminal of the third transistor;
   a fourth transistor having a first terminal coupled to the second terminal of the second transistor, a second terminal coupled to a third bias voltage, a control terminal coupled to the control terminal of the third transistor and to the memory address decoder for receiving a fourth bias voltage, and a bulk terminal; and
   a boosting capacitor coupled to the first terminal of the first transistor; and
   a memory address decoder coupled to the voltage switch circuits and configured to output an address to select a voltage switch circuit accordingly;
   wherein in each state of conditioning the selected voltage switch circuit, only one bias voltage is changed.

2. The memory of claim 1, wherein the first transistor, the second transistor, and the third transistor are formed on a first deep well and the fourth transistor is formed on a second deep well.

3. The memory of claim 2, wherein the first deep well is coupled to a first deep well voltage, and the second deep well and the bulk terminal of the fourth transistor are coupled to a second deep well voltage.

4. The memory of claim 2, wherein the first transistor, the second transistor, and the third transistor are NMOS transistors, the fourth transistor is a PMOS transistor, and the first deep well and the second deep well are deep N-wells.

5. The memory of claim 1, wherein the second terminal of the third transistor is coupled to a common mode voltage.

6. The memory of claim 1, wherein the first bias voltage is switched among a common mode voltage, a power supply voltage, or a first voltage magnitude.

7. The memory of claim 1, wherein the second bias voltage is switched among a common mode voltage, a power supply voltage, or a second voltage magnitude.

8. The memory of claim 1, wherein the third bias voltage is switched among a common mode voltage, a power supply voltage, or a third voltage magnitude.

9. The memory of claim 1, wherein the fourth bias voltage is switched among a common mode voltage, a power supply voltage, or a fourth voltage magnitude.

10. A method of operation of a voltage switch circuit, comprising:
   precharging an output terminal of the voltage switch circuit to a third voltage magnitude;
   conditioning the voltage switch circuit; and
   boosting the output terminal to a write voltage;
   wherein in each state of conditioning the voltage switch circuit, only one bias voltage is changed, a first terminal of a first transistor of the voltage switch circuit is coupled to the output terminal of the voltage switch circuit, a first terminal of a boosting capacitor of the voltage switch circuit and a write unit; a bulk terminal and a second terminal of the first transistor are coupled to a first terminal of a second transistor of the voltage switch circuit; a bulk terminal and a second terminal of the second transistor are coupled to a first terminal of a fourth transistor of the voltage switch circuit and a first terminal of a third transistor of the voltage switch circuit; a bulk terminal and a second terminal of the third transistor are coupled to a common mode voltage; a control terminal of the fourth transistor is coupled to a control terminal of the third transistor; the first transistor, the second transistor, and the third transistor are formed on a first deep well; and the fourth transistor is formed on a second deep well.

11. The method of claim 10, wherein precharging an output terminal of the voltage switch circuit to the third voltage magnitude comprises:
   inputting a boost clock with the common mode voltage to a second terminal of the boosting capacitor;
   inputting a fourth bias voltage with a fourth voltage magnitude to the control terminal of the fourth transistor and to the control terminal of the third transistor;
   inputting a first bias voltage with a first voltage magnitude to a control terminal of the first transistor;
   inputting a second bias voltage with a second voltage magnitude to a control terminal of the second transistor;
   inputting a third bias voltage with the third voltage magnitude to the second terminal of the fourth transistor;
   inputting a first deep well voltage with the common mode voltage to the first deep well and changing the fourth bias voltage from the fourth voltage magnitude to the common mode voltage;
   changing the first deep well voltage from the common mode voltage to the third voltage magnitude; and
   inputting a second deep well voltage with the third voltage magnitude to the second deep well;
   wherein the first voltage magnitude is greater than or equal to the second voltage magnitude, and the second voltage magnitude is greater than the third voltage magnitude.

12. The method of claim 11, wherein conditioning the voltage switch circuit comprises:
   changing the second bias voltage from the second voltage magnitude to the common mode voltage;
   changing the third bias voltage from the third voltage magnitude to a power supply voltage and changing the second deep well voltage from the third voltage magnitude to the power supply voltage;
   changing the first bias voltage from the first voltage magnitude to the common mode voltage;
   changing the second bias voltage from the common mode voltage to the power supply voltage; and
   changing the first bias voltage from the common mode voltage to the first voltage magnitude.

13. The method of claim 12, wherein boosting the output terminal to the write voltage comprises:
   changing the first deep well voltage from the third voltage magnitude to the write voltage; and
   changing the boost clock from the common mode voltage to the fourth voltage magnitude.

14. The method of claim 11, wherein the first bias voltage is switched among the common mode voltage, a power supply voltage, or the first voltage magnitude.

15. The method of claim 11, wherein the second bias voltage is switched among the common mode voltage, a power supply voltage, or the second voltage magnitude.

16. The method of claim 11, wherein the third bias voltage is switched among the common mode voltage, a power supply voltage, or the third voltage magnitude.

17. The method of claim 11, wherein the fourth bias voltage is switched among the common mode voltage, a power supply voltage, or the fourth voltage magnitude.

18. The method of claim 10, wherein the first transistor, the second transistor, and the third transistor are NMOS transistors, the fourth transistor is a PMOS transistor, and the first deep well and the second deep well are deep N-wells.

\* \* \* \* \*